(12) United States Patent
Heck et al.

(10) Patent No.: US 7,368,808 B2
(45) Date of Patent: May 6, 2008

(54) MEMS PACKAGING USING A NON-SILICON SUBSTRATE FOR ENCAPSULATION AND INTERCONNECTION

(75) Inventors: John Heck, Palo Alto, CA (US); Joseph S. Hayden, III, Sunnyvale, CA (US); Steve W. Greathouse, Chandler, AZ (US); Daniel M. Wong, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 10/611,334

(22) Filed: Jun. 30, 2003

(65) Prior Publication Data

US 2006/0194361 A1    Aug. 31, 2006

(51) Int. Cl.
*H01L 23/02* (2006.01)
*H01L 21/44* (2006.01)

(52) U.S. Cl. .............. 257/678; 257/684; 257/704; 438/106; 438/107

(58) Field of Classification Search ............... 438/25, 438/51, 106–108, 113; 257/414, 678, 684, 257/704
See application file for complete search history.

(56) References Cited

U.S. PATENT DOCUMENTS

| 6,630,725 B1 * | 10/2003 | Kuo et al. .............. 257/659 |
| 6,846,725 B2 * | 1/2005 | Nagarajan et al. .......... 438/456 |
| 7,170,155 B2 * | 1/2007 | Heck et al. .............. 257/684 |

* cited by examiner

*Primary Examiner*—Hsien-Ming Lee
(74) *Attorney, Agent, or Firm*—Kevin A. Relf

(57) ABSTRACT

A MEMS die is bonded to a cap to form a MEMS device. The cap is non-silicon and has an electrical via extending from one side of the cap to another side of the cap. In one embodiment, a plurality of caps is wafer bonded to a plurality of MEMS dice.

7 Claims, 6 Drawing Sheets

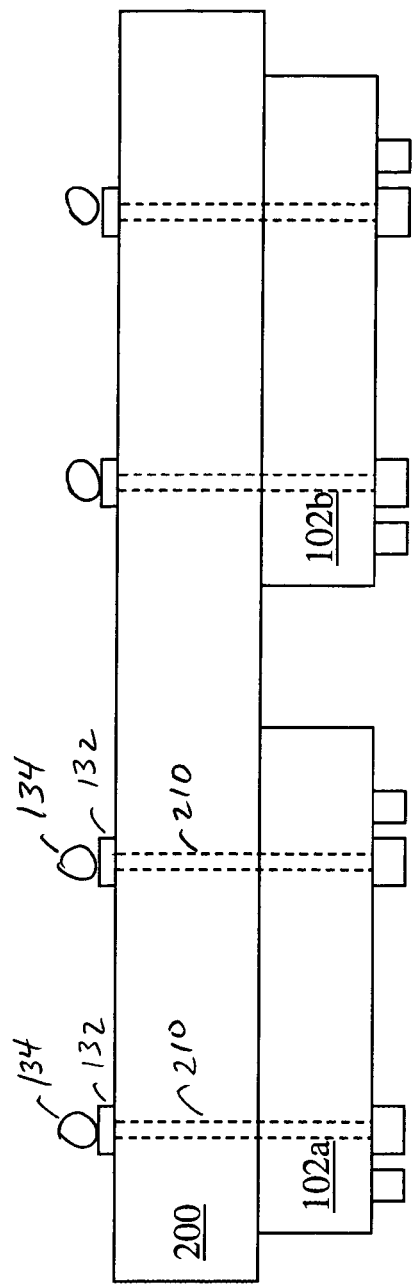
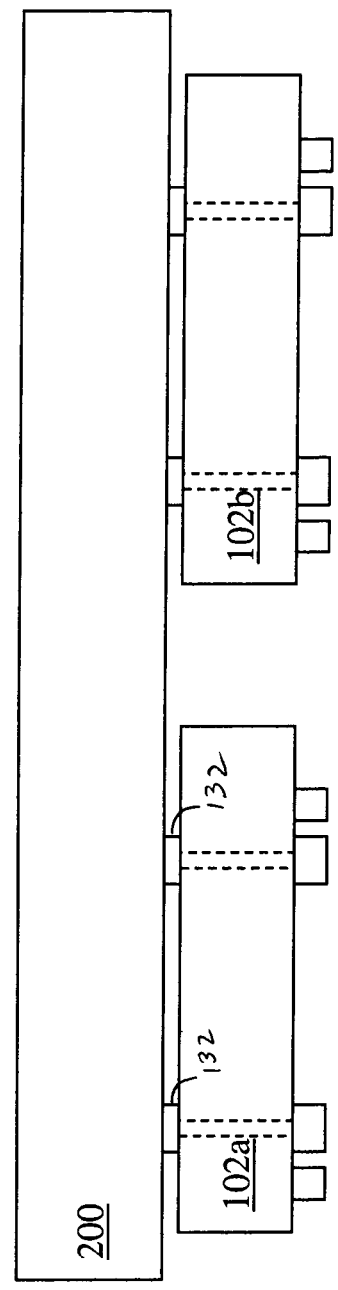
Fig 3A
Fig 3B

MEMS PACKAGING USING A NON-SILICON SUBSTRATE FOR ENCAPSULATION AND INTERCONNECTION

FIELD

This invention relates generally to microelectromechanical structures (MEMS) and particularly to techniques for packaging MEMS.

DESCRIPTION OF RELATED ART

In some cases, MEMS components such as accelerometers, gyroscopes, optical micromirrors, varactors, switches and resonators are packaged in a hermetic environment. For example, particularly with radio frequency (RF) MEMS components, there may be a need for hermetic packaging. Such packaging protects the MEMS components from the outside environment.

Conventionally, two approaches have been utilized for hermetic packaging of MEMS components. Ceramic packages with cavities that may be sealed are used in the defense industry. This approach, while reliable, may be cost prohibitive for many commercial applications.

Another approach is to use a glass frit to bond a cover to a wafer containing the MEMS components to a cover. However, this technique requires high temperature bonding that may not be suitable for all components utilized in some MEMS applications. In some cases, the glass frit occupies a large area that increases the size of the resulting product and therefore increases its costs. In some cases, the glass frit bonding technology uses wire bonds for electrical connections that may not be adequate in some applications, such as high frequency applications.

FIG. 1 is a schematic diagram that shows a prior art MEMS device 10. In this case, a MEMS component 12 is formed on a semiconductor substrate 14. A cap 16 is bonded to the semiconductor substrate at a seal 20 that encloses the MEMS component 12. One or more electrical conductors 24, 26 extend through the seal to an exterior of the MEMS device 10. One or more wire bonds 30 are then attached to the electrical conductors 24, 26. However, the wire bonds 30 need adequate room for proper electrical connection, so additional real estate for the semiconductor substrate is typically required. Wire bonds may also be inadequate in some applications such as high frequency applications because of issues such as unacceptable inductance and package parasitics.

Thus, there is a need for better ways to package MEMS components.

BRIEF DESCRIPTION OF THE DRAWINGS

FIGS. 3A and 3B are schematic diagrams that show alternative embodiments of the plurality of caps coupled to a common carrier.

Note that use of the same reference numbers in different figures indicates the same or like elements.

DETAILED DESCRIPTION

A method and apparatus for packaging MEMS devices is described. In one embodiment, a plurality of MEMS dice are wafer bonded to a plurality of non-silicon caps to encapsulate the MEMS components in an interior of the MEMS devices. The caps have an electrical via that extends from the interior of the MEMS device to an exterior. This architecture allows for a cap and a corresponding MEMS die to have similar dimensions. Thus, the overall MEMS device size may be reduced.

Figure 1:
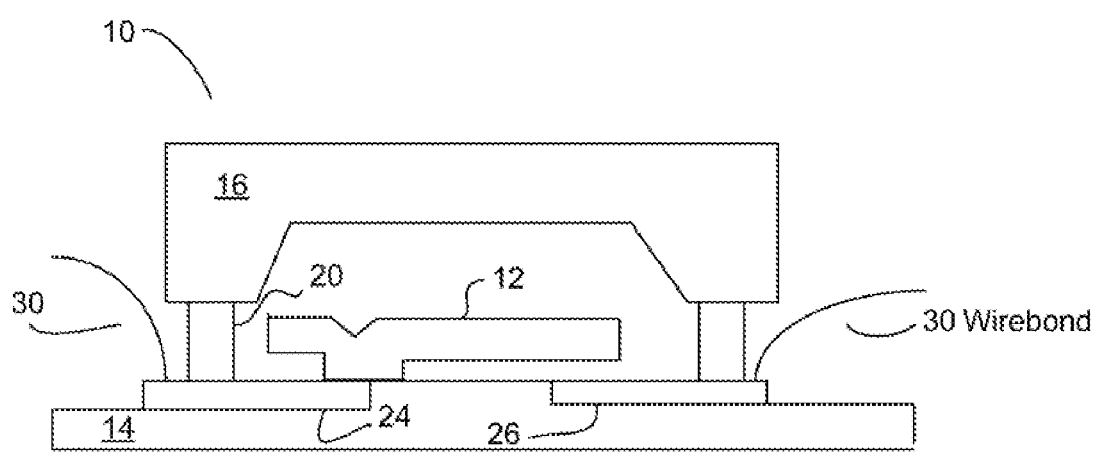
FIG. 1 is a schematic diagram that shows a prior art MEMS device.
Figure 2:
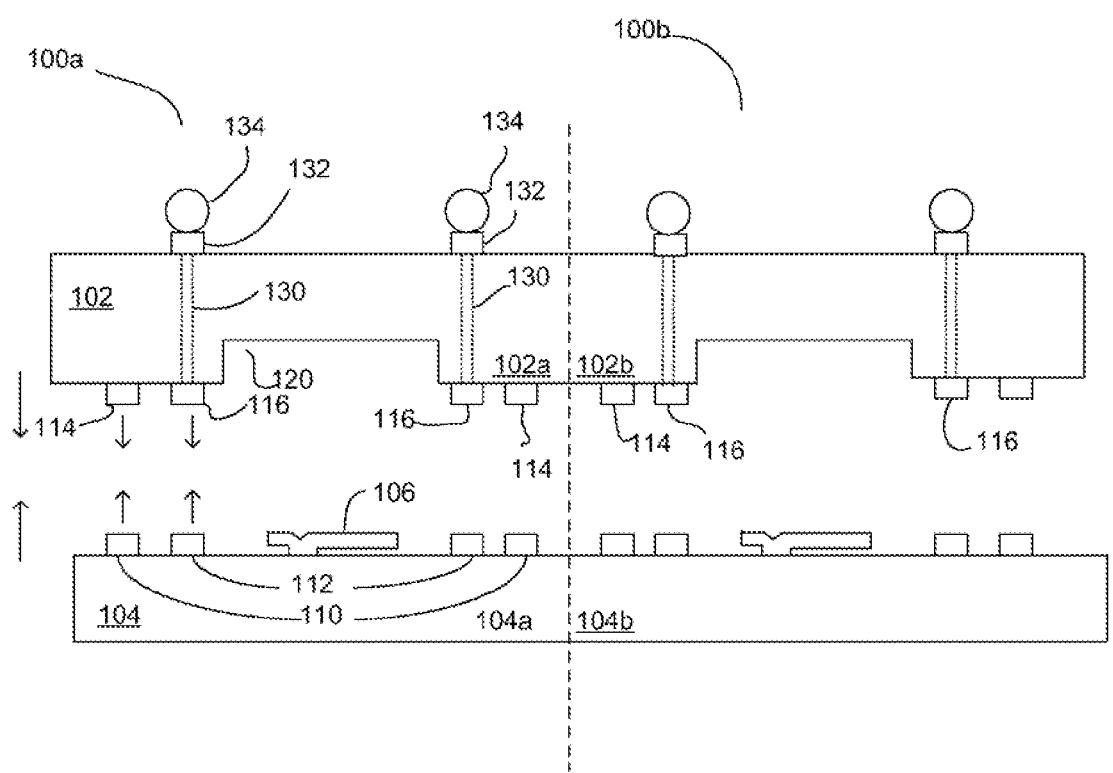
FIG. 2 is a schematic diagram that shows one embodiment of a cross-sectional view of multiple MEMS devices, such as on wafer prior to singulation, or separation, of the MEMS devices.

FIG. 2 is a schematic diagram that shows one embodiment of a cross-sectional view of multiple MEMS devices 100a and 100b, such as on wafer prior to singulation, or separation, of the MEMS devices.

A MEMS component 106, such as a radio frequency (RF) MEMS component, including as examples a varactor, a switch or a resonator, may be formed on a semiconductor substrate 104.

A plurality of bond pads 112 may also be formed on the semiconductor substrate 104. A seal ring 110 encircles the MEMS component 106, as will be more clearly shown with respect to FIG. 3B. In one embodiment, the seal ring 110 forms a hermetic seal protecting the MEMS component 106 within an interior cavity.

Electrical connections between the bond pads 112 and the MEMS component 106 are not shown. Those skilled in the art will appreciate that various electrical connections may be formed on or within the semiconductor substrate 104.

In one embodiment, a first MEMS die 104a may be manufactured directly adjacent another MEMS die 104b. In one embodiment, each of the MEMS dice 104a and 104b may be released so that they are movable. A plurality of caps 102a and 102b are then bonded to the MEMS dice 104a and 104b to form one or more MEMS devices. The MEMS devices are later singulated in a dicing process.

In one embodiment, the plurality of caps 102a and 102b have bond pads 116 that correspond with bond pads 112 of the MEMS dice. The plurality of caps may also have a corresponding seal ring 114 that bonds with the seal ring 110 of the MEMS dice. A cavity 120 may or may not be present, depending upon whether the bond pads 112, 116 and seal rings 114, 110 are high enough to provide adequate clearance over the MEMS component 106.

In one embodiment, the plurality of caps are formed on a common non-silicon substrate. For example, the caps may be formed on a ceramic substrate, such as a zero-shrink ceramic or a low temperature cofired ceramic (LTCC).

In one embodiment, the ceramic starts out as a tape. Holes are punched in the tape and metal is screen printed over the tape to fill the holes and create electrical vias through the tape. One or more tape layers are co-fired to produce the ceramic substrate. Although previously, ceramic exhibited large shrinkage during firing, and tolerances were rather poor, a zero-shrink ceramic may be fired with a 0.05% to 0.10% tolerance.

Electrical vias 130 are shown within substrate 102. In one embodiment, the electrical vias 130 couple bond pads 116 from within the MEMS device to bond pads 132 on the exterior of the MEMS device. A solder ball 134 may be formed on bond pads 132 to allow the MEMS device to be easily bonded to an electrical interface.

FIG. 3A is a schematic diagram that shows an alternative embodiment of the plurality of caps coupled to a common carrier. Instead of the plurality of caps being part of a continuous substrate, as was described with respect to FIG. 2, multiple individual caps 102a and 102b are assembled on a common carrier 200. This embodiment may reduce alignment issues due to shrinkage of the continuous substrate during co-firing. In one embodiment, various electrical connections 210, 132 and/or solder balls 134 may be employed within and on the surface of the common carrier 200. FIG. 3B is a schematic diagram that shows an embodiment in which the carrier 200 has no electrical connections, but serves to hold the caps 102a and 102b until they are assembled, at which point the carrier 200 is removed.

Figure 4A:
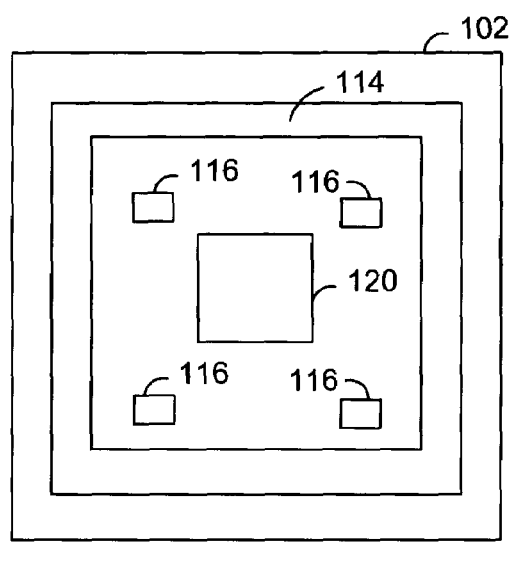
FIG. 4A is a top view of one embodiment of a single cap for a MEMS device.

FIG. 4A is a top view of one embodiment of a single cap for a MEMS device. A seal ring 114 is formed on the non-silicon substrate 102 One or more bond pads 116 may be formed to provide electrical connectivity between the interior of the MEMS device and the exterior.

Figure 4B:
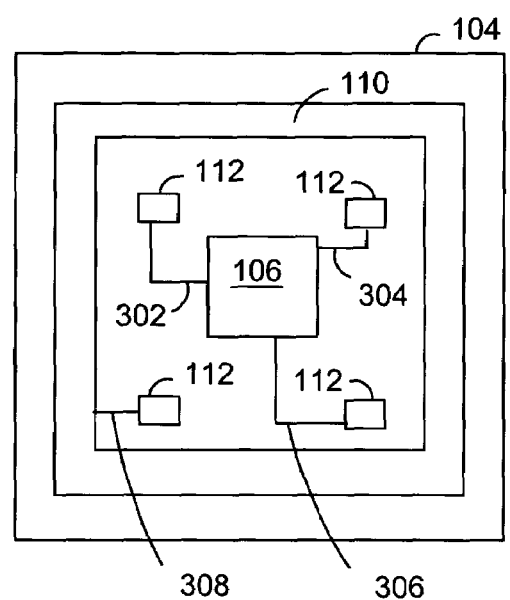
FIG. 4B is a top view of one embodiment of a single MEMS die.

FIG. 4B is a top view of one embodiment of a single MEMS die. A seal ring 110 is formed on the substrate 104. One or more bond pads 112 may be formed to provide electrical connectivity between the bond pads 116 of the corresponding cap and the MEMS component 106. Various electrical connections 302, 304, 306, 308 connect the bond pads 112 to the MEMS component 106, seal ring 110 and/or substrate 104.

Figure 5:
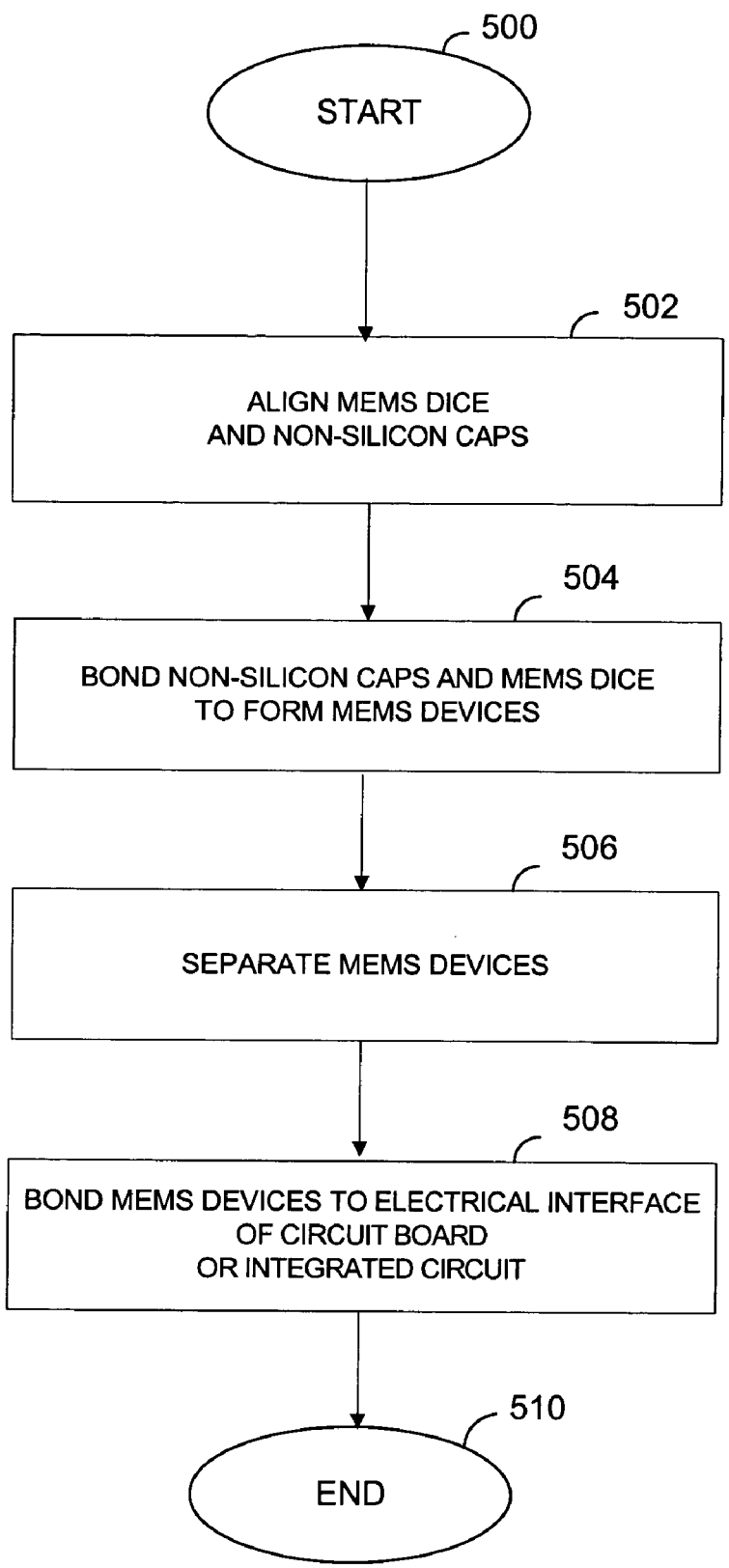
FIG. 5 is a flowchart illustrating a method of making a MEMS device.

FIG. 5 is a flowchart illustrating a method of making a MEMS device. The flowcharts starts at block 500, and continues at block 502, at which one or more MEMS die are aligned with non-silicon caps. As previously described, the non-silicon caps may be on a single substrate, or they may be formed on multiple substrates but are held together via a common carrier.

The flowchart continues at block 504, at which the one or more non-silicon caps are bonded to the one or more MEMS dice to form the MEMS devices. The bonding process may be one of thermocompression, e.g., gold-to-gold thermocompression bonding, solder, eutectic or other types of bonding.

The flowchart continues at block 506, at which the MEMS devices are separated by dicing the wafer. The flowchart continues at block 508, at which one or more of the MEMS devices may then be bonded, e.g. by a solder bond, to an electrical interface. For example, a MEMS device may be surface mounted directly to a circuit board, or may be bonded to another integrated circuit chip, such as a microprocessor or controller for the MEMS device. In one embodiment, the MEMS device additionally comprises a surface mounted integrated circuit chip, and the entire structure may then be bonded to a circuit board, for example.

Figure 6:
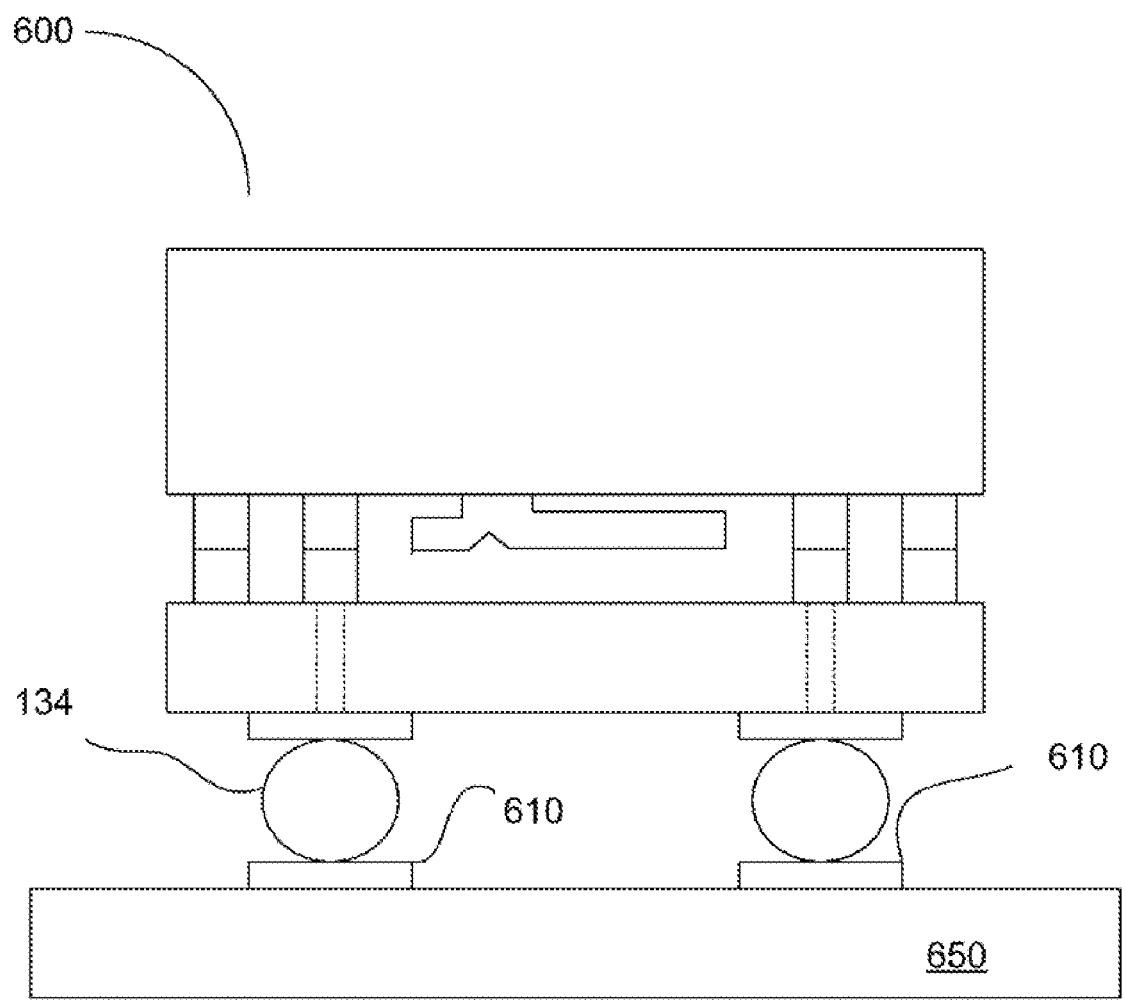
FIG. 6 is a schematic diagram showing one embodiment of a MEMS device after singulation.

FIG. 6 is a schematic diagram showing one embodiment of a MEMS device 600, such as that described with respect to FIGS. 2, 3, 4A and 4B, after singulation. The MEMS device may be coupled via solder balls 134 to an electrical interface such as bond pads 610 of a circuit board or an integrated circuit chip 650.

Thus, a method and apparatus for packaging MEMS devices is disclosed. However, the specific embodiments and methods described herein are merely illustrative. For example, although some of the detailed description refers to an RF MEMS components, the described method and apparatus apply to other types of MEMS devices. Similarly, although a ceramic cap substrate has been described, other non-silicon substrates may alternatively be employed. Additionally, although some figures were described showing only two MEMS devices on a substrate, the number of MEMS devices is not limited to two. Numerous modifications in form and detail may be made without departing from the scope of the invention as claimed below. The invention is limited only by the scope of the appended claims.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

What is claimed is:

1. An apparatus comprising:
a plurality of MEMS dice formed on a substrate; and
a plurality of caps bonded to the plurality of MEMS dice, the plurality of caps having at least one electrical via extending from a first side of the plurality of caps to a second side of the plurality of caps,
wherein one of the plurality of MEMS dice and one of the plurality of caps forms a device interior and a device exterior, and the electrical via extends from the device interior to the device exterior,
wherein the plurality of caps comprises ceramic and wherein the plurality of caps are coupled to each other by a carrier.

2. The apparatus of claim 1, wherein the electrical via is coupled to a solder ball on the device exterior.

3. An apparatus comprising:
a plurality of MEMS dice formed on a substrate; and
a plurality of caps bonded to the plurality of MEMS dice, the plurality of caps having at least one electrical via extending from a first side of the plurality of caps to a second side of the plurality of caps,
wherein one of the plurality of MEMS dice and one of the plurality of caps forms a device interior and a device exterior, and the electrical via extends from the device interior to the device exterior,
wherein the plurality of caps comprises a zero-shrink ceramic.

4. A apparatus comprising:
a MEMS die formed on a semiconductor substrate; and
a ceramic cap bonded to the MEMS die to form a hermetically sealed interior, the ceramic cap having at least one electrical via extending from a hermetically sealed interior through the ceramic cap to an exterior, wherein the ceramic cap is a zero-shrink ceramic.

5. The apparatus of claim 4, wherein the at least one electrical via is coupled to a solder ball on the exterior.

6. The apparatus of claim 4 further comprising:
a circuit board, wherein the circuit board is electrically coupled to the MEMS die by a solder ball and the electrical via.

7. The apparatus of claim 4 further comprising:
an integrated circuit chip, wherein the integrated circuit chip is electrically coupled to the MEMS die by a solder ball and the electrical via.

* * * * *